(12) United States Patent
Lee et al.

(10) Patent No.: US 9,972,372 B2
(45) Date of Patent: May 15, 2018

(54) SIGNAL SHIFTING CIRCUIT, BASE CHIP, AND SEMICONDUCTOR SYSTEM INCLUDING THE SAME

(71) Applicant: SK hynix Inc., Gyeonggi-do (KR)

(72) Inventors: Hyun-Sung Lee, Gyeonggi-do (KR); Chun-Seok Jeong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/169,287

(22) Filed: May 31, 2016

(65) Prior Publication Data

US 2017/0186470 A1   Jun. 29, 2017

(30) Foreign Application Priority Data

Dec. 23, 2015  (KR) ..................... 10-2015-0185165

(51) Int. Cl.
| | |
|---|---|
| *G11C 7/22* | (2006.01) |
| *G11C 7/10* | (2006.01) |
| *G11C 8/12* | (2006.01) |
| *G11C 8/18* | (2006.01) |

(52) U.S. Cl.
CPC ............... *G11C 7/22* (2013.01); *G11C 7/10* (2013.01); *G11C 7/222* (2013.01); *G11C 8/12* (2013.01); *G11C 8/18* (2013.01); *G11C 2207/2272* (2013.01)

(58) Field of Classification Search
CPC .................................. G11C 7/22; G11C 7/10
See application file for complete search history.

(56) References Cited

U.S. PATENT DOCUMENTS

| | | | | |
|---|---|---|---|---|
| 6,778,465 B2* | 8/2004 | Shin | ...................... | G11C 7/1051 365/194 |
| 7,782,992 B2* | 8/2010 | Nagarajan | ............. | H04L 7/0012 375/355 |
| 8,826,057 B1* | 9/2014 | Chin | ................... | G06F 13/4054 710/60 |
| 2005/0237838 A1* | 10/2005 | Kwak | ............... | G11C 11/40618 365/222 |
| 2007/0159910 A1* | 7/2007 | Yoshida | ............... | G11C 7/1066 365/230.03 |
| 2008/0136799 A1* | 6/2008 | Nakamura | ............. | G11C 19/28 345/204 |
| 2011/0026337 A1* | 2/2011 | Kwack | ..................... | G11C 7/18 365/193 |
| 2012/0008433 A1* | 1/2012 | Yoon | ....................... | G11C 7/22 365/194 |

(Continued)

FOREIGN PATENT DOCUMENTS

KR    101097437    12/2011

*Primary Examiner* — Douglas King
(74) *Attorney, Agent, or Firm* — IP & T Group LLP

(57) ABSTRACT

A signal shifting circuit may include a bank selection signal generation unit suitable for generating a bank selection signal synchronized with a first clock in response to a bank address and an internal write signal; and a shifting device suitable for generating a shifted bank selection signal by shifting the bank selection signal by a number of times according to latency information and for advancing a phase of the shifted bank selection signal whenever shifting the bank selection signal once or more so that the shifted bank selection signal is synchronized with a second clock having a phase leading a phase of the first clock.

20 Claims, 9 Drawing Sheets

(56) References Cited

U.S. PATENT DOCUMENTS

| | | | |
|---|---|---|---|
| 2013/0208546 A1* | 8/2013 | Kim | G11C 8/18 365/189.02 |
| 2013/0214833 A1* | 8/2013 | Kim | G11C 7/1066 327/156 |
| 2014/0043926 A1* | 2/2014 | Kim, II | G11C 7/22 365/194 |
| 2014/0264936 A1 | 9/2014 | Choi et al. | |

* cited by examiner

SIGNAL SHIFTING CIRCUIT, BASE CHIP, AND SEMICONDUCTOR SYSTEM INCLUDING THE SAME

CROSS-REFERENCE TO RELATED APPLICATION

The present application claims priority of Korean Patent Application No. 10-2015-0185165, filed on Dec. 23, 2015, which is incorporated herein by reference in its entirety.

BACKGROUND

1. Field

Exemplary embodiments of the present invention relate to a signal shifting circuit, a base chip, and a semiconductor system including the same.

2. Description of the Related Art

FIG. 1 is a diagram showing a semiconductor system including a plurality of chips including a base chip BASE and four core chips CORE0 to CORE3.

The core chips CORE0 to CORE3 are sequentially stacked over a base chip BASE. Each core chip includes a plurality of memory banks (not shown). The base chip BASE is responsible for external communication with a semiconductor package. The base chip BASE may generate signals for controlling the plurality of core chips CORE0 to CORE3 in response to externally provided commands and addresses and may send the generated signals to the respective core chips CORE0 to CORE3 through the through vias TSVs or transfer data between the plurality of core chips CORE0 to CORE3 and external devices.

The semiconductor system typically uses a data strobe signal in order to accurately recognize externally provided data during a write operation. The data strobe signal is transmitted from a chipset to the semiconductor package along with data, and toggles between two states during one clock cycle. Data and an external clock are transmitted from the chipset to the semiconductor memory device through different transmission lines. An error is generated in the recognition of the data due to a difference in the transmission speed of the different transmission lines. Accordingly, the chipset transfers the data strobe signal to the semiconductor system through a transmission line for the data strobe signal, which is similar to a transmission line for the transmission of the data. Strobe signal encoding allows the semiconductor system to more accurately recognize the data.

In the case of the semiconductor system including the plurality of chips as shown in FIG. 1, data and a data strobe signal are provided to the core chips CORE0 to CORE3 through the base chip BASE. Therefore, each of the core chips CORE0 to CORE3 needs to receive a portion of the data strobe signal because the data strobe signal is transferred from the base chip BASE to all of the core chips CORE0 to CORE3. In this case, a margin may be reduced due to a phase difference between the internal clock of the semiconductor system and the data strobe signal.

SUMMARY

Various embodiments are directed to a signal shifting circuit, base chip, and semiconductor system capable of gradually changing a phase of a shifted bank selection signal according to plural reference clocks having gradually changing phases when shifting a bank selection signal thereby preventing an error even when the reference clocks are changed.

In an embodiment, a signal shifting circuit may include a bank selection signal generation unit suitable for generating a bank selection signal synchronized with a first clock in response to a bank address and an Internal write signal; and a shifting device suitable for generating a shifted bank selection signal by shifting the bank selection signal by a number of times according to latency information and for advancing a phase of the shifted bank selection signal whenever shifting the bank selection signal once or more so that the shifted bank selection signal is synchronized with a second clock having a phase leading a phase of the first clock.

In an embodiment, a semiconductor system may include a base chip suitable for: transferring a write strobe signal; generating a plurality of shifted bank selection signals by shifting a plurality of bank selection signals synchronized with a delayed internal clock, which is delayed from an internal clock, by a number of times according to latency information; and a plurality of core chips comprising a plurality of memory banks, respectively and stacked over the base chip, and suitable for receiving write data according to the plurality of shifted bank selection signals, respectively and the write strobe signal, wherein the base chip advances phases of the plurality of shifted bank selection signals whenever shifting the plurality of bank selection signals once or more so that the plurality of shifted bank selection signals is synchronized with the internal clock having a phase leading a phase of the delayed internal clock.

In an embodiment, a signal shifting circuit may include a plurality of shifting units coupled in series, and suitable for shifting an input signal and outputting the shifted signal, wherein one or more among the plurality of shifting units shift the respective input signals, and wherein the plurality of shifting units operate in synchronization with first to N-th clocks having sequentially different phases, respectively, to generate the shifting signal synchronized with the N-th clock by sequentially changing a phase of the Input signal synchronized with the first clock.

DETAILED DESCRIPTION

Figure 1:
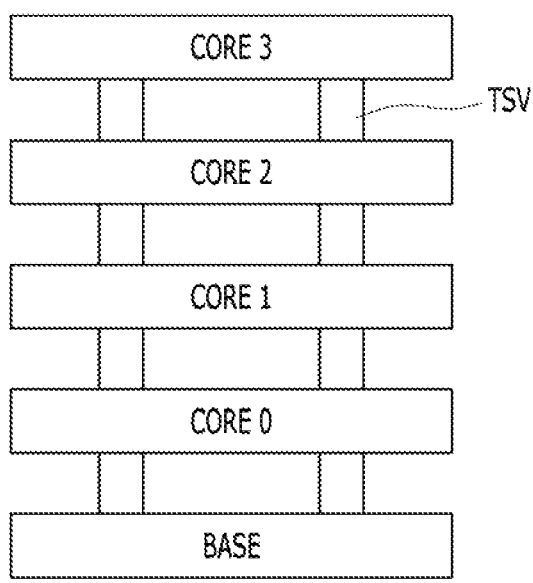
FIG. 1 is a diagram showing a semiconductor system including a plurality of chips.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The terminology used herein is for the purpose of describing particular embodiments only and is not intended to be limiting of the present invention. As used herein, singular forms are intended to include the plural forms as well, unless the context clearly indicates otherwise.

It will be further understood that the terms "comprises", "comprising", "Includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

In some instances, as would be apparent to one of ordinary skill in the art elements described in connection with a particular embodiment may be used singly or in combination with other embodiments unless otherwise specifically indicated.

Hereinafter, the various embodiments of the present invention will be described in detail with reference to the attached drawings.

Figure 2:
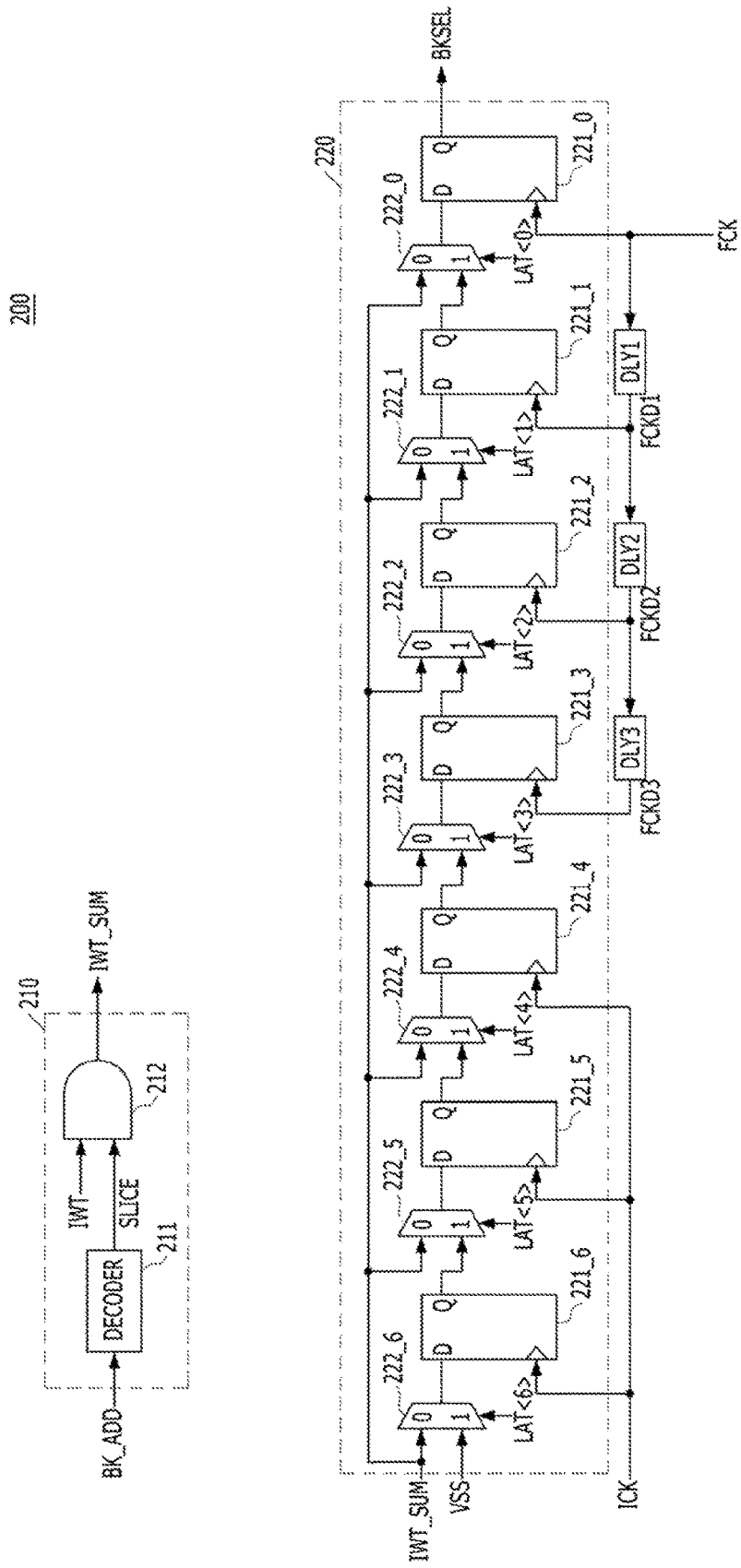
FIG. 2 is a diagram showing a configuration of a signal shifting circuit, according to an embodiment of the present invention.

Referring now to FIG. 2 a signal shifting circuit generally designated with numeral 200 is provided, according to an embodiment of the present invention.

According to the embodiment of FIG. 2, the signal shifting circuit 200 may include a bank selection signal generation unit 210 and a shifting device 220.

The bank selection signal generation unit 210 may generate a bank selection signal IWT_SUM, which is synchronized with a first clock ICK, in response to a bank address BK_ADD and an internal write signal ITW. For such an operation, the bank selection signal generation unit 210 may include a decoder 211 and a signal combination unit 212. The decoder 211 may generate a slice signal SLICE by decoding the bank address BK_ADD. The decoder 211 may enable the slice signal SLICE when the value of the bank address BK_ADD has a specific value and may disable the slice signal SLICE when the value of the bank address BK_ADD has a value other than the specific value. The signal combination unit 212 may generate the bank selection signal IWT_SUM by combining the internal write signal ITW and the slice signal SLICE. Both the internal write signal ITW and the bank selection signal IWT_SUM may be synchronized with the first clock ICK.

The shifting device 220 generates a shifted bank selection signal BKSEL by shifting the bank selection signal IWT_SUM according to latency information LAT<0:6>. The shifting device 220 may advance the phase of the shifted bank selection signal BKSEL whenever it shifts the bank selection signal IWT_SUM more than once so that the shifted bank selection signal BKSEL is synchronized with a second clock FCK having a phase leading the phase of the first clock ICK.

The shifting device 220 may generate the shifted bank selection signal BKSEL by shifting the bank selection signal IWT_SUM more than twice. Whenever the shifting device 220 shifts the bank selection signal IWT_SUM once, the shifting device 220 may maintain or advance the phase of the shifted bank selection signal BKSEL. The shifting device 220 may generate the shifted bank selection signal BKSEL by gradually changing the phase of the shifted bank selection signal BKSEL whenever it shifts the bank selection signal IWT_SUM.

For such an operation, the shifting device 220 may include a plurality of shifting units 221_0 to 221_6 and a plurality of selection units 222_0 to 222_6. The plurality of shifting units 221_0 to 221_6 may be coupled in series. The plurality of selection units 222_0 to 222_6 correspond to the latency information LAT<0:6>, respectively. For example, for each of the latency information LAT<0:6> having a binary value of "0", a corresponding one of the plurality of selection units 222_0 to 222_6 may transfer the bank selection signal IWT_SUM to a corresponding one of the shifting units 221_0 to 221_6 through a terminal 0. For each of the latency information LAT<0:6> having a binary value of "1", a corresponding one of the plurality of selection units 222_0 to 222_6 may transfer a signal output from the shifting unit of a previous stage to a corresponding one of the shifting units 221_0 to 221_6 through a terminal 1. Each of the shifting units 221_0 to 221_6 may include a D-flip flop.

The latency information LAT<0:6> represents the number of shifts that the bank selection signal IWT_SUM is subjected to for the generation of the shifted bank selection signal BKSEL.

For example, if the shifted bank selection signal BKSEL is to be generated by shifting the bank selection signal IWT_SUM six times, the latency information LAT<0:6> may have a binary value of "0111111" (in order from LAT<6> to LAT<0>). In this case, only the selection unit 222_6 transfers the bank selection signal IWT_SUM to corresponding shifting unit 221_6 through the terminal 0. Each of the remaining selection units 222_0 to 222_5 transfers the signal of its previous stage to a corresponding next stage shifting unit among the plurality of shifting units 221_0 to 221_5 through the terminal 1. Specifically, selection unit 222_5 transfers the signal of the shifting unit 221_6 to the shifting unit 221_5, selection unit 222_4 transfers the signal of the shifting unit 221_5 to the shifting unit 221_4, selection unit 222_3 transfers the signal of the shifting unit 221_4 to the shifting unit 221_3, selection unit 222_2 transfers the signal of the shifting unit 221_3 to the shifting unit 221_2, selection unit 222_1 transfers the signal of the shifting unit 221_2 to the shifting unit 221_1, and selection unit 222_0 transfers the signal of the shifting unit 221_1 to the shifting unit 221_0. Therefore, the bank selection signal IWT_SUM may be shifted six times by the six shifting units 221_0 to 221_5.

For another example, if the shifted bank selection signal BKSEL is to be generated by shifting the bank selection signal IWT_SUM three times, the latency information LAT<0:6> may have a binary value of "0000111" (in order from LAT<6> to LAT<0>). In this case, the bank selection signal IWT_SUM may be shifted three times by the three shifting units 221_0 to 221_3. For yet another example, if the shifted bank selection signal BKSEL is to be generated by the bank selection signal IWT_SUM once, the latency information (LAT<0:6>) may have a binary value of "0000001" (in order from LAT<6> to LAT<0>). In this case, the bank selection signal IWT_SUM may be shifted once by the single shifting unit 221_0.

For reference, in the semiconductor memory system, semiconductor devices operate by exchanging signals. A standby time has been defined until an operation corresponding to a specific signal is executed after the specific signal is applied. Such a standby time is called latency. For example, in the semiconductor memory system, the time until data is actually output after a read command is applied is called a CAS latency, and the time until data is actually inputted after a write command is applied is called a write latency.

Each of the plurality of shifting units 221_0 to 221_6 may shift an input signal in synchronization with a corresponding clock of a plurality of clocks ICK, FCK, and FCKD1 to FCKD3. In this case, each of the intermediate clocks FCKD1 to FCKD3 may have a phase between the first clock ICK and the second clock FCK. The shifting unit 221_6 of the foremost stage may be in synchronization with the first clock ICK. The shifting unit 221_0 of the last stage may be in synchronization with the second clock FCK. Each of the shifting units 221_1 to 221_5 coupled between the shifting unit 221_6 of the foremost stage and the shifting unit 221_0 of the last stage may be in synchronization with a clock having a phase leading or the same phase as a clock, with which a shifting unit of a previous stage is synchronized.

For example, the shifting unit 221_3 of a fourth stage may be in synchronization with a clock having a phase leading or the same phase as a clock, with which the shifting unit 221_4 of a third stage is synchronized.

The phases of signals output from the shifting units 221_0 to 221_6 are synchronized with the phases of corresponding clocks with which the shifting units 221_0 to 221_6 are synchronized, respectively. Accordingly, the phase of the output signal of each of the shifting units 221_0 to 221_6 may be changed by changing the phase of the corresponding clock.

FIG. 2 shows an example in which the shifting units 221_6, 221_5, and 221_4 operate in synchronization with the first clock CK1, the shifting unit 221_3 operates in synchronization with the intermediate clock FCKD3, the shifting unit 221_2 operates in synchronization with the intermediate clock FCKD2, the shifting unit 221_1 operates in synchronization with the Intermediate clock FCKD1, and the shifting unit 221_0 operates in synchronization with the second clock FCK. In this case, the phase of the respective clocks is backward advanced in the order of the clocks ICK, FCKD3, FCKD2, FCKD1, and FCK. Each of the intermediate clocks FCKD1 to FCKD3 may be generated by delaying the second clock FCK by different delay amounts. To this end, delay units DLY1 to DLY3 may be used.

As described above, as the phases of the clocks FCK, FCKD1, FCKD2, FCKD3, and ICK respectively for the shifting units 221_0 to 221_6 become advanced, a signal synchronized with the first clock ICK may be gradually synchronized with the second clock FCK by advancing the phase of the bank selection signal IWT_SUM whenever the bank selection signal IWT_SUM is shifted. In this case, a problem which may occur due to a margin can be reduced compared to a case where the signal synchronized with the first clock ICK is synchronized with the second clock FCK at a time.

Figure 3:
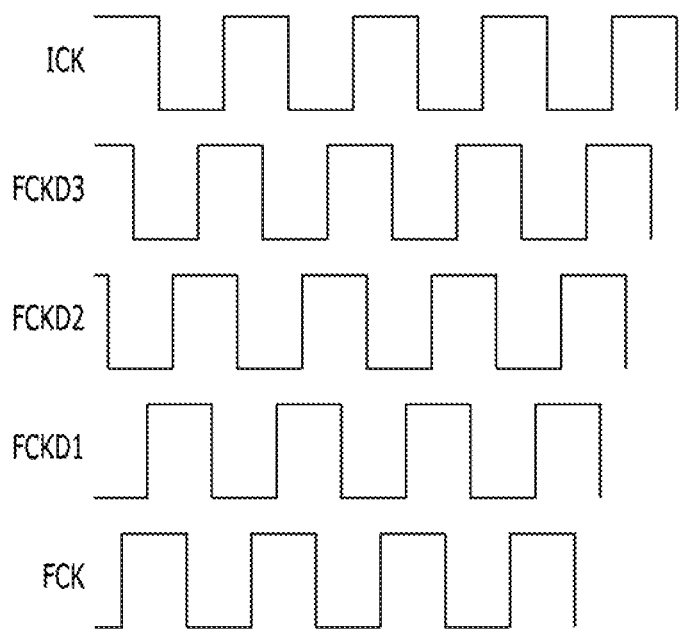
FIG. 3 is a diagram showing a phase relationship between clocks used in the signal shifting circuit of FIG. 2.

FIG. 3 is a diagram showing a phase relationship between the clocks ICK, FCKD3, FCKD2, FCKD1, and FCK used in the signal shifting circuit of FIG. 2.

Figure 4:
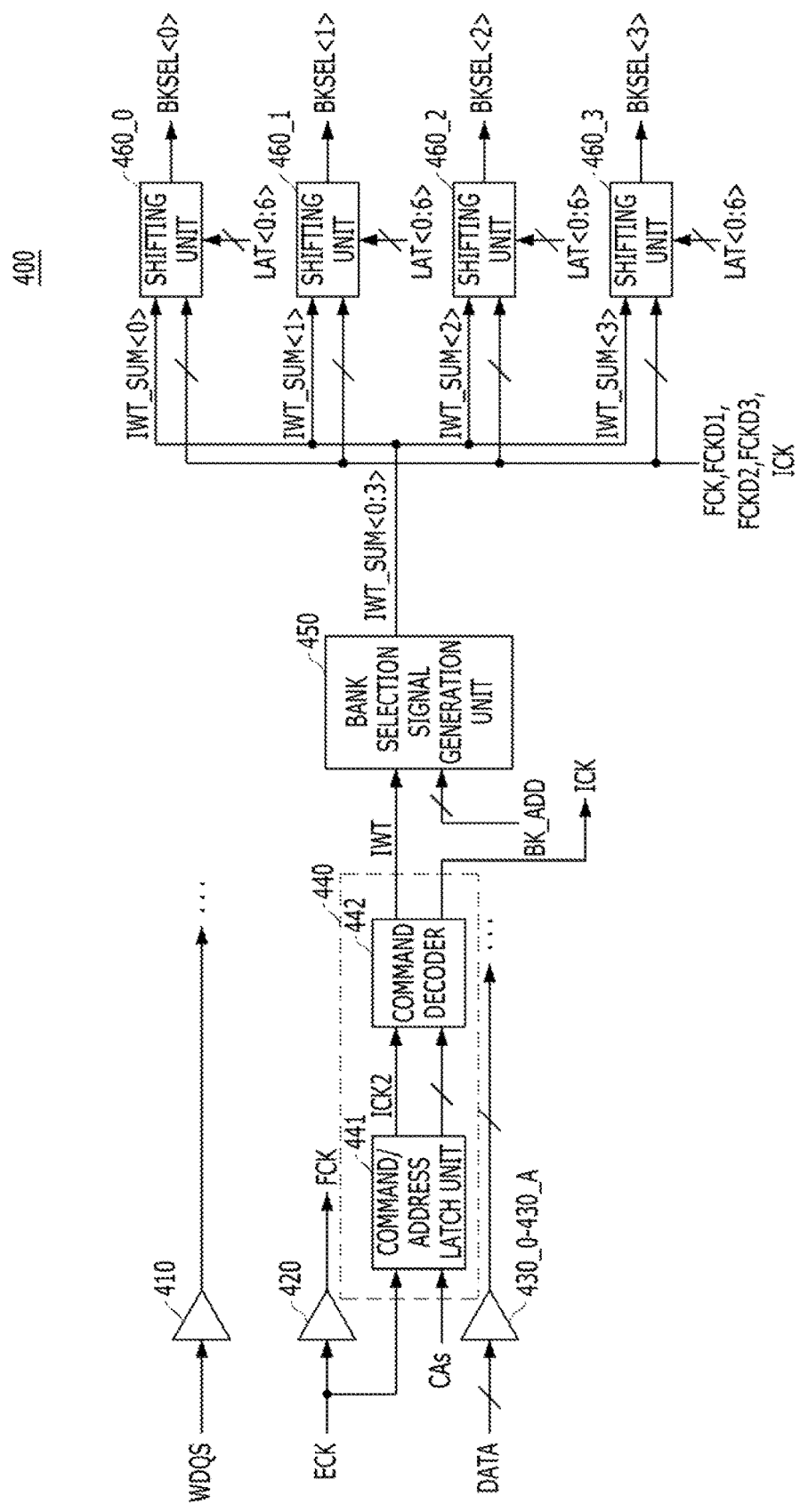
FIG. 4 is a diagram showing a configuration of a base chip, according to an embodiment of the present invention.

Referring to FIG. 3, the phases of the clocks ICK, FCKD3, FCKD2, FCKD1, and FCK are gradually advanced in the recited order. A difference between the phases of the first clock ICK and the second clock FCK may be smaller than 1 tCK(1tCK is a time corresponding to one period of the first clock ICK and the second clock FCK). FIG. 4 is a diagram showing the configuration of a base chip generally designated with numeral 400, according to an embodiment of the present invention.

Referring to FIG. 4, the base chip 400 may include a first buffer 410, a second buffer 420, a plurality of third buffers 430_0 to 430_A, an internal command signal generation unit 440, a bank selection signal generation unit 450, and a plurality of shifting units 460_0 to 460_3.

The first buffer 410 may transfer a write strobe signal WDQS to the core chips CORE0 to CORE3. The second buffer 420 may receive an external clock ECK and generate an internal clock FCK, which corresponds to the second clock FCK of FIGS. 2 and 3. The plurality of third buffers 430_0 to 430_A may transfer data DATA to the core chips CORE0 to CORE3.

The internal command signal generation unit 440 may include a command/address latch unit 441 and a command decoder 442. The command/address latch unit 441 may latch and output externally provided command/address signals CAs. The command decoder 442 may generate the internal write signal ITW using the command address signals CAs output from the command/address latch unit 441. In this case, the command/address latch unit 441 and the command decoder 442 may operate in synchronization with a clock. The command/address latch unit 441 may operate in synchronization with the external clock ECK. The command decoder 442 may operate in synchronization with a clock ICK2 output from the command/address latch unit 441. The internal command signal generation unit 440 may delay the external clock ECK to generate delayed internal clock ICK, which correspond to the first clock ICK of FIGS. 2 and 3.

The bank selection signal generation unit 450 may generate a plurality of bank selection signals IWT_SUM<0:3>, synchronized with the first clock ICK in response to the bank address BKADD and the internal write signal ITW. The plurality of bank selection signals IWT_SUM<0:3> may correspond to core chips CORE0 to CORE3, respectively. The bank selection signal generation unit 450 may operate in similar way to the bank selection signal generation unit 210 of FIG. 2.

The configuration and operation of each of the plurality of shifting units 460_0 to 460_3 may be the same as the shifting device 220 of FIG. 2. Each of the plurality of shifting units 460_0 to 460_3 may generate each of the shifted bank selection signals BKSEL<0:3> by shifting each of the bank selection signals IWT_SUM<0:3> by a number of times represented by corresponding latency information LAT<0:6>. In this case, the shifted bank selection signal BKSEL<0:3> may be a signal synchronized with the second clock FCK.

The base chip BASE may generate output a plurality of shifted bank selection signals BKSEL<0:3> to the respective core chips CORE0 to CORE3. Furthermore, the base chip BASE may send the write strobe signal WDQS and the data DATA to the core chips CORE0 to CORE3. Signals transmitted between the base chip BASE and the core chips and between the core chips may be transmitted through vias (not shown in FIG. 4).

Figure 5:
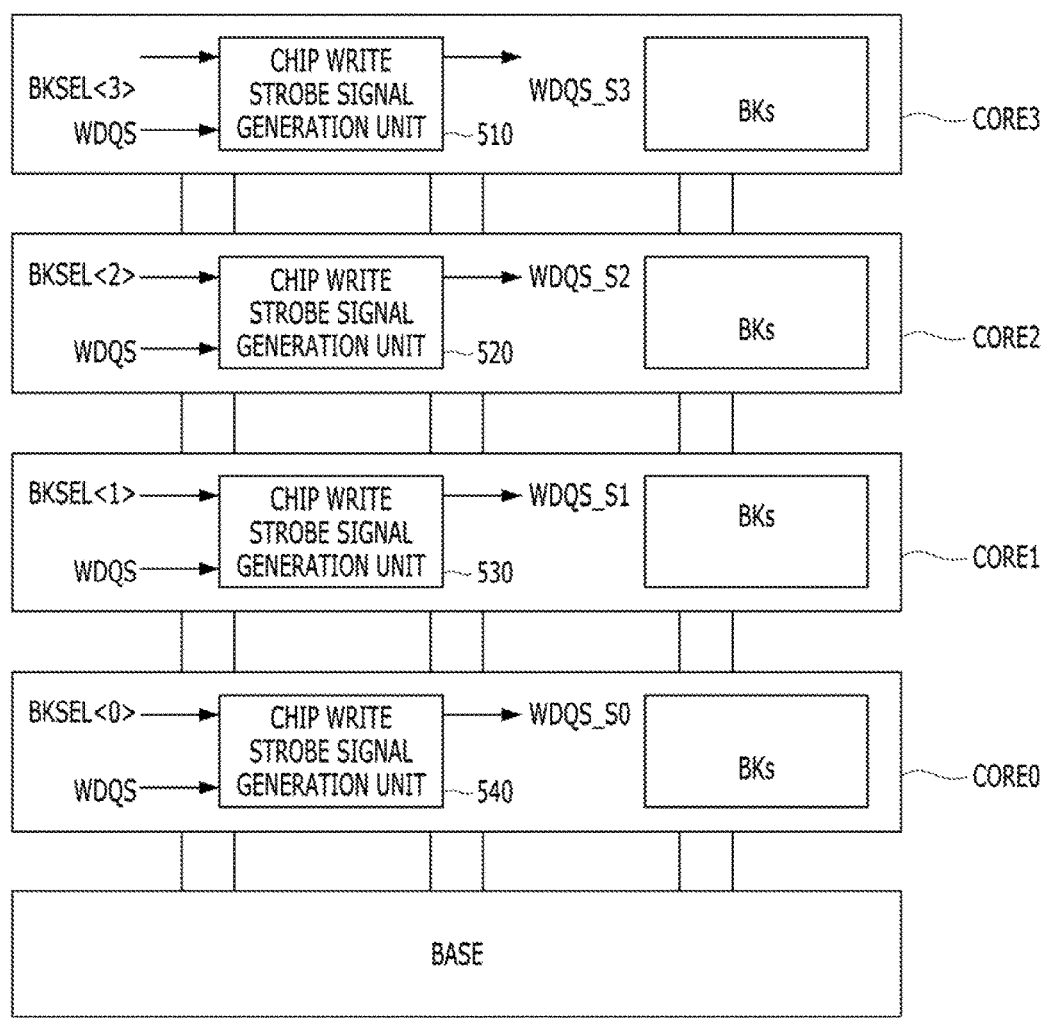
FIG. 5 is a diagram showing a configuration of a semiconductor system, according to an embodiment of the present invention.

FIG. 5 is a diagram showing a configuration of a semiconductor system, according to an embodiment of the present invention.

The semiconductor system, according to the embodiment of FIG. 5, may include the base chip BASE and the plurality of core chips CORE0 to CORE3. Although, only four core chips are illustrated in the embodiment of FIG. 5, we note that the number of core chips may vary by design.

The plurality of core chips CORE0 to CORE3 may be sequentially stacked over the base chip BASE, and include a plurality of memory banks BKs and chip write strobe signal generation units 510 to 540, respectively. The memory banks BKs may include a plurality of memory cells (not shown in FIG. 5) for storing and outputting data.

The chip write strobe signal generation units 510 to 540 may generate chip write strobe signals WDQS_S0 to WDQS_S3 for the core chips CORE0 to CORE3 in response to the shifted bank selection signals BKSEL<0:3> and the write strobe signal WDQS, respectively. The chips CORE0 to CORE3 may receive data to be written in response to the chip write strobe signals WDQS_S0 to WDQS_S3, respectively.

Figure 6:
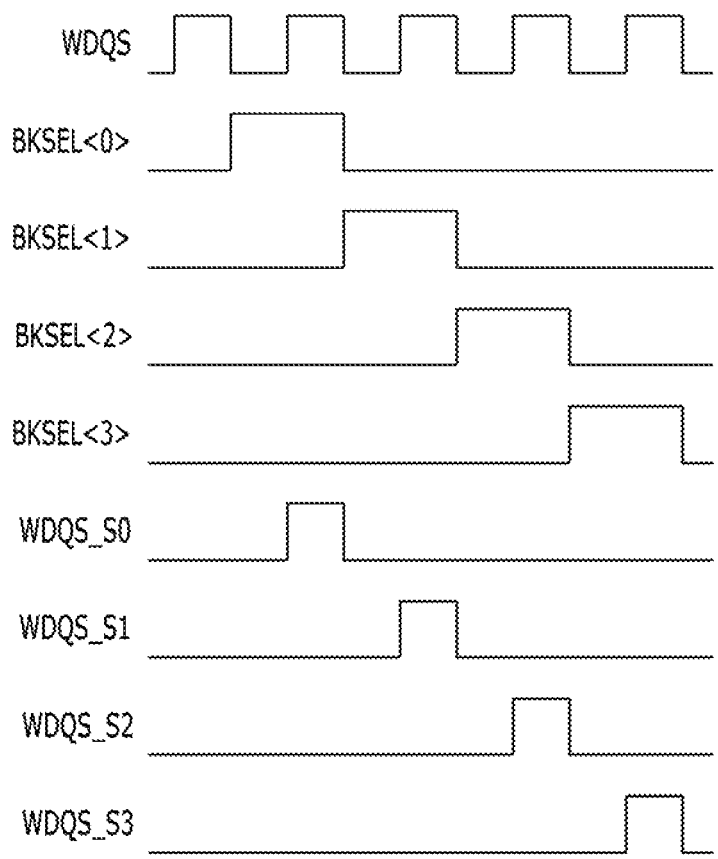
FIG. 6 is a diagram illustrating an operation of the semiconductor system of FIG. 5.

FIG. 6 is a diagram illustrating the operation of the semiconductor system of FIG. 5.

Referring to FIG. 6, the write strobe signal WDQS may be toggled for transmission of data to banks BKs included in the core chips CORE0 to CORE3.

In FIG. 6, the first toggle of the write strobe signal WDQS is a preamble the second toggle thereof may corresponds to data to be transmitted to a bank included in the core chip CORE0, the third toggle thereof may corresponds to data to be transmitted to a bank included in the core chip CORE1, the fourth toggle thereof may corresponds to data to be transmitted to a bank included in the core chip CORE2, and the fifth toggle thereof may corresponds to data to be transmitted to a bank included in the core chip CORE3.

In this case, the shifting bank signals BKSEL<0:3> are generated by the plurality of shifting units 460_0 to 460_3, respectively. The shifting bank signals BKSEL<0:3> may be transmitted to the respective core chips CORE0 to CORE3. The core chips CORE0 to CORE3 may generate the respective chip write strobe signals WDQS_S0 to WDQS_S3 using the write strobe signal WDQS and the respective shifted bank selection signals BKSEL<0:3>.

Figure 7:
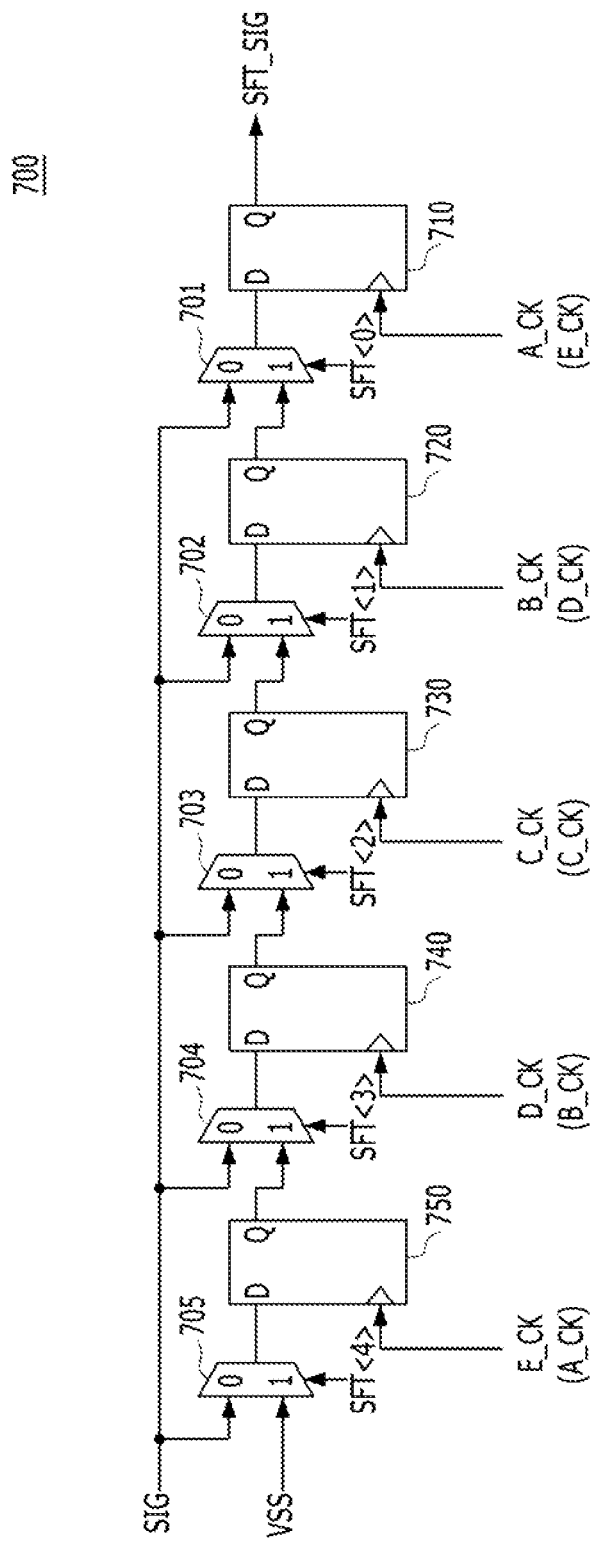
FIG. 7 is a diagram showing a configuration of a signal shifting circuit, according to an embodiment of the present invention.

FIG. 7 is a diagram showing the configuration of a signal shifting circuit generally designated by numeral 700, according to an embodiment of the present invention.

Referring to FIG. 7, the signal shifting circuit may include a plurality of shifting units 710 to 750 and a plurality of selection units 701 to 705. The plurality of shifting units 710 to 750 may perform shifting in synchronization with corresponding one of a plurality of clocks A_CK to E_CK. In this case, the phase of a signal shifted by one of the shifting units 710 to 750 may be the same as that of a corresponding one of the clocks A_CK to E_CK, with which the shifting unit is synchronized.

The signal shifting circuit of FIG. 7 may select one or more of the plurality of shifting units 710 to 750 for shifting an input signal SIG according to shifting information SFT<0:4>.

In a first embodiment, when the shifting units 710 to 750 operate in synchronization with the respective clocks A_CK to E_CK and the input signal SIG is to be synchronized with the clock E_CK, the shifting units 710 to 750 shift the input signal SIG in sequential synchronization with the clock E_CK, the clock D_CK, the clock C_CK, the clock B_CK, and the clock A_CK. Accordingly, the phases of signals respectively shifted by the shifting units 710 to 750 are sequentially changed according to the phases of the clock E_CK, the clock D_CK, the clock C_CK, the clock B_CK, and the clock A_CK in this order, and thus an output signal of the signal shifting circuit of FIG. 7 or a shifting signal SHT_SIG is synchronized with the clock A_CK.

In a second embodiment, when the shifting units 710 to 750 operate in synchronization with the respective clocks E_CK to A_CK and the input signal SIG is to be synchronized with the clock A_CK, the shifting units 710 to 750 shift the input signal SIG in sequential synchronization with the clock A_CK, the clock B_CK, the clock C_CK, the clock D_CK, and the clock E_CK. Accordingly, the phases of signals respectively shifted by the shifting units 710 to 750 are sequentially changed according to the phases of the clock A_CK, the clock B_CK, the clock C_CK, the clock D_CK, and the clock E_CK in this order, and thus the shifting signal SHT_SIG is synchronized with the clock E_CK.

Figure 9:
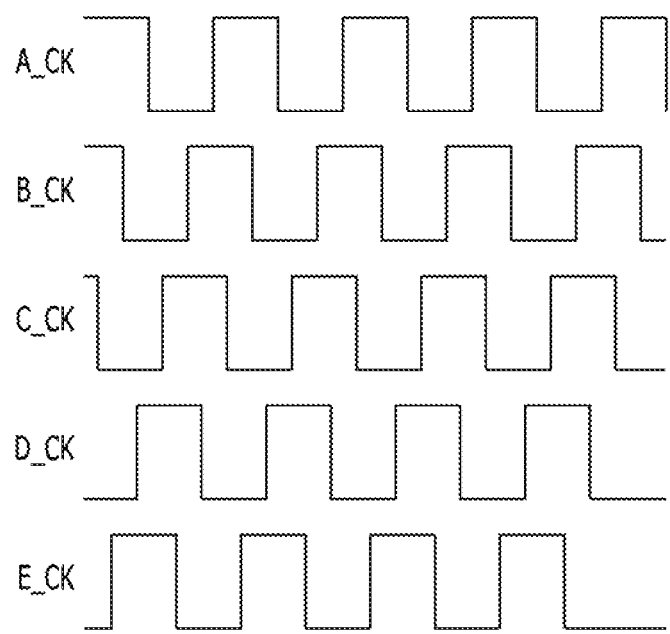
FIG. 9 is a diagram showing a phase relationship between clocks used in the signal shifting circuits of FIGS. 7 and 8.

When it is assumed that the phase of the clock E_CK is most advanced among the plurality of clocks A_CK to E_CK and the phases of the clocks D_CK to A_CK are gradually lagged in order of the clock D_CK, the clock C_CK, the clock B_CK, and the clock A_CK as exemplified in FIG. 9. Accordingly, the phases of shifted signals may be gradually lagged in the first embodiment while the phases of shifted signals may be gradually advanced in the second embodiment.

As described above, a signal is gradually shifted through the plural clocks having sequentially leading or lagging phases, a reduction of a margin can be prevented and the phase of a clock, with which a signal has been synchronized, can be changed.

Figure 8:
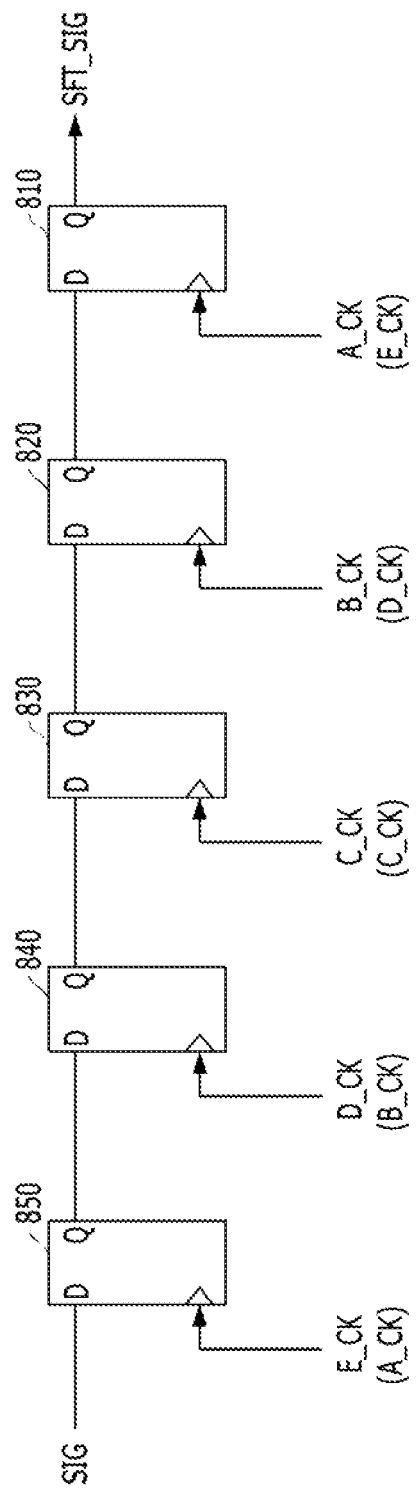
FIG. 8 is a diagram showing a configuration of a signal shifting circuit, according to another embodiment of the present invention.

FIG. 8 is a diagram showing a configuration of a signal shifting circuit, according to another embodiment of the present invention.

Referring to FIG. 8, the signal shifting circuit may include a plurality of shifting units 810 to 850. The plurality of shifting units 810 to 850 may perform shifting in synchronization with the respective clocks of a plurality of clocks A_CK to E_CK. The signal shifting circuit of FIG. 8 has the same operation as the shifting circuit of FIG. 7 except that it is unable to select a shifting unit used to shift the input signal SIG and it generates the shifting signal SHT_SIG by shifting the input signal SIG using all of the shifting units 810 to 850 always.

FIG. 9 is a diagram showing a phase relationship between the clocks used in the signal shifting circuits of FIGS. 7 and 8.

Referring to FIG. 9, the phases of the clocks A_CK, B_CK, C_CK, D_CK, and E_CK may be gradually advanced in the recited order and a difference between the phases of the clock A_CK and the clock E_CK may be smaller than 1 tCK.

This technology can prevent a problem due to a phase difference of a reference clock when changing the reference clock with which the bank selection signal is synchronized by gradually changing the phase of the bank selection signal while shifting the bank selection signal.

Although various embodiments have been described for illustrative purposes, it will be apparent to those skilled in the art that various changes and modifications may be made without departing from the spirit and or scope of the invention as defined in the following claims.

What is claimed is:

1. A signal shifting circuit, comprising:
   a bank selection signal generation unit configured to generate a bank selection signal synchronized with a first clock in response to a bank address and an internal write signal; and
   a shifting device configured to generate a shifted bank selection signal by shifting a phase of the bank selection signal according to latency information, and advance a phase of the shifted bank selection signal whenever shifting the bank selection signal once or more so that the shifted bank selection signal is synchronized with a second clock having a phase leading a phase of the first clock.

2. The signal shifting circuit of claim 1, wherein the shifting device generates the shifted bank selection signal by gradually changing the phase of the shifted bank selection signal whenever shifting the bank selection signal.

3. The signal shifting circuit of claim 1, wherein the shifting device comprises a plurality of shifting units coupled in series, and generates the shifted bank selection signal by shifting the bank selection signal using two or more shifting units selected according to the latency information among the plurality of shifting units.

4. The signal shifting circuit of claim 3, wherein:
   the plurality of shifting units shift respective input signals in synchronization with a corresponding one of a plurality of clocks, and
   the plurality of clocks comprises the first clock, the second clock, and one or more intermediate clocks each having a phase between the phases of the first clock and the second clock.

5. The signal shifting circuit of claim 4, wherein:
   one of a foremost stage among the plurality of shifting units performs shifting in synchronization with the first clock,
   one of a last stage among the plurality of shifting units performs shifting in synchronization with the second clock, and
   each of remaining ones among the plurality of shifting units performs shifting in synchronization with a clock having a phase leading or the same phase as another clock, with which a shifting unit of a previous stage among the plurality of shifting units, among the plurality of clocks.

6. The signal shifting circuit of claim 4, wherein the one or more intermediate clocks comprise clocks generated by delaying the second clock by different delay amounts.

7. A semiconductor system, comprising:
   a base chip configured to:
   transfer a write strobe signal;
   generate a plurality of shifted bank selection signals by shifting phases of a plurality of bank selection signals synchronized with a delayed internal clock, which is delayed from an internal clock, according to latency information; and
   a plurality of core chips comprising a plurality of memory banks, respectively and stacked over the base chip, and configured to receive write data according to the plurality of shifted bank selection signals, respectively and the write strobe signal,
   wherein the base chip advances phases of the plurality of shifted bank selection signals whenever shifting the plurality of bank selection signals once or more so that the plurality of shifted bank selection signals is synchronized with the internal clock having a phase leading a phase of the delayed internal clock.

8. The semiconductor system of claim 7, wherein the plurality of core chips generates a plurality of chip write strobe signals, respectively, by combining the plurality of shifted bank selection signals, respectively, and the write strobe signal.

9. The semiconductor system of claim 8, wherein each of the plurality of core chips receives the write data in synchronization with each of the plurality of chip write strobe signals.

10. The semiconductor system of claim 7, wherein the base chip comprises:
    a first buffer configured to receive the write strobe signal;
    a second buffer configured to generate the internal clock using an externally provided clock and;
    an internal command signal generation unit configured to latch a plurality of command/address signals in response to the internal clock, generate an internal write signal in response to a latched command signal, and generate a delayed internal clock by delaying the internal clock; and
    a plurality of shifting units, each configured to generate the shifted bank selection signal by shifting the bank selection signal by a number of times according to a latency information in response to a bank address and the internal write signal,
    wherein the plurality of shifting units advances a phase of the shifted bank selection signal whenever shifting the bank selection signal once or more so that the shifted bank selection signal is synchronized with the internal clock.

11. The semiconductor system of claim 10, wherein each of the plurality of shifting unit generates each of the plurality of shifted bank selection signals by gradually changing the phase of the shifted bank selection signal whenever shifting the bank selection signal.

12. The semiconductor system of claim 10, wherein each of the plurality of shifting devices comprises a plurality of shifting units coupled in series, and generates the shifted bank selection signal by shifting the bank selection signal using two or more shifting units selected according to the latency information among the plurality of shifting units.

13. The semiconductor system of claim 12, wherein:
    the plurality of shifting units shift respective input signals in synchronization with corresponding one of a plurality of clocks, and
    the plurality of clocks comprises the first clock, the second clock, and one or more intermediate clocks each having a phase between phases of the first clock and the second clock.

14. The semiconductor system of claim 13, wherein:
    one of a foremost stage among the plurality of shifting units performs shifting in synchronization with the first clock,
    one of a last stage among the plurality of shifting units performs shifting in synchronization with the second clock, and
    each of remaining ones among the plurality of shifting units performs shifting in synchronization with a clock having a phase leading or the same phase as another clock, with which a shifting unit of a previous stage among the plurality of shifting units, among the plurality of clocks.

15. The semiconductor system of claim 13, wherein the one or more intermediate clocks comprise clocks generated by delaying the second clock by different latency values.

16. The semiconductor system of claim 7, wherein the base chip sends the plurality of shifted bank selection signals to the plurality of core chips, respectively.

17. A signal shifting circuit, comprising:
a plurality of shifting units coupled in series, and configured to shift a bank selection signal and outputting a shifted signal,
wherein one or more among the plurality of shifting units shift the bank selection signal, and
wherein the plurality of shifting units operate in synchronization with first to N-th clocks having sequentially different phases, respectively, to generate the shifted signal synchronized with the N-th clock by sequentially changing a phase of the bank selection signal synchronized with the first clock in response to a bank address and an internal write signal.

18. The signal shifting circuit of claim 17, wherein:
one of a foremost stage among the plurality of shifting units operates in synchronization with the first clock,
one of a last stage among the plurality of shifting units operates in synchronization with the N-th clock, and
each of remaining ones among the plurality of shifting units performs shifting in synchronization with a clock having a phase becoming close to a phase of the N-th clock as advancing to a last one of the remaining shifting units.

19. The signal shifting circuit of claim 18, wherein a phase of the first clock leads a phase of the second clock.

20. The signal shifting circuit of claim 18, wherein a phase of the second clock leads a phase of the first clock.

* * * * *